US009135099B2

(12) United States Patent
Chen et al.

(10) Patent No.: US 9,135,099 B2
(45) Date of Patent: Sep. 15, 2015

(54) MEMORY ERROR CORRECTION (75) Inventors: Yun-Han Chen, Chiayi (TW);
Sung-Chieh Lin, Zhubei (TW);
Kuoyuan (Peter) Hsu, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 185 days.

(21) Appl. No.: 13/434,588

(22) Filed: Mar. 29, 2012

(65) Prior Publication Data
US 2013/0262962 A1 Oct. 3, 2013

(51) Int. Cl.
*G11C 29/00* (2006.01)
*G06F 11/07* (2006.01)
*G06F 11/10* (2006.01)
*H03M 13/19* (2006.01)
*H03M 13/00* (2006.01)

(52) U.S. Cl.
CPC .......... *G06F 11/073* (2013.01); *G06F 11/0793* (2013.01); *G06F 11/1008* (2013.01); *H03M 13/19* (2013.01); *H03M 13/6561* (2013.01)

(58) Field of Classification Search
None
See application file for complete search history.

(56) References Cited

U.S. PATENT DOCUMENTS

| | | | | |
|---|---|---|---|---|
| 4,366,478 A * | 12/1982 | Masuda et al. | ............... | 340/3.43 |
| 4,369,511 A * | 1/1983 | Kimura et al. | ............... | 714/719 |
| 4,742,519 A * | 5/1988 | Abe et al. | ................ | 714/755 |
| 5,206,831 A * | 4/1993 | Wakamatsu | ................. | 365/200 |
| 5,555,212 A * | 9/1996 | Toshiaki et al. | ............... | 365/200 |
| 7,386,771 B2 * | 6/2008 | Shuma | ........................ | 714/718 |
| 7,876,638 B2 * | 1/2011 | Pekny | ...................... | 365/230.03 |
| 8,065,574 B1 * | 11/2011 | Cheng et al. | .................. | 714/725 |
| 8,281,227 B2 * | 10/2012 | Thatcher et al. | ............. | 714/770 |
| 8,345,501 B2 * | 1/2013 | Jeong | ......................... | 365/225.7 |
| 8,365,042 B2 * | 1/2013 | Wang et al. | .................... | 714/763 |
| 8,687,444 B2 * | 4/2014 | Ide et al. | ........................ | 365/200 |
| 2004/0136257 A1 * | 7/2004 | Nelson et al. | ............... | 365/225.7 |
| 2004/0153904 A1 * | 8/2004 | Lin et al. | ........................ | 714/710 |
| 2004/0255088 A1 * | 12/2004 | Scheuerlein | .................. | 711/154 |
| 2007/0255981 A1 * | 11/2007 | Eto | ................ | 714/710 |
| 2008/0209284 A1 * | 8/2008 | Louie et al. | .................... | 714/718 |
| 2013/0082404 A1 * | 4/2013 | Kajigaya et al. | ............. | 257/777 |

* cited by examiner

*Primary Examiner* — Daniel McMahon
(74) *Attorney, Agent, or Firm* — Lowe Hauptman & Ham, LLP (57) ABSTRACT

A method includes, by a first circuit, converting a plurality of bits in a first format to a second format. The plurality of bits in the second format is used, by a second circuit, to program a plurality of memory cells corresponding to the plurality of bits. The first format is a parallel format. The second format is a serial format. The first circuit and the second circuit are electrically coupled together in a chip. In some embodiments, the plurality of bits includes address information, cell data information, and program information of a memory cell that has an error. In some embodiments, the plurality of bits includes word data information of a word and error code and correction information corresponding to the word data information of the word.

20 Claims, 7 Drawing Sheets

| IN1 | IN2 | OUT |
|---|---|---|
| 1 | 0 | 0 |
| 1 | 1 | 1 |

FIG. 6

MEMORY ERROR CORRECTION

FIELD

The present disclosure is related to correcting memory errors.

BACKGROUND

In various memory applications including those using electrical fuses (eFuses), when a memory cell or memory bit in a memory array has an error, a set of redundancy information is stored in a redundancy memory. The redundancy information includes the address and correct data of the erroneous cell. When the erroneous cell is later accessed, the correct data of the erroneous cell which is part of the redundancy information is used as the access data. Effectively, the erroneous data is corrected.

In an existing approach, after the erroneous cell is identified, a customer using an eFuse array uses a mapping table to identify the redundancy information corresponding to the erroneous eFuse cell. The customer then uses the information identified in the mapping table to program the redundancy eFuses representing the redundancy information. Correcting the erroneous eFuse is thus manual, i.e., the correction process starting from recognizing the erroneous eFuse to programming the redundancy eFuses needs human intervention.

In memory error correction mechanisms, parity bits associated with a data word having a plurality of bits are generated. If the data word has an erroneous bit, the parity bits are used to identify and correct an identified erroneous bit. For example, in an approach using the Hamming code algorithm, seven parity bits are used to identify and correct an erroneous memory bit. If the data word has 32 bits, $2^{32}$ combinations of or sets of seven parity bits are provided to correspond to $2^{32}$ combinations of the data word. In an existing approach related to eFuses, the $2^{32}$ combinations of the seven parity bits are provided in a mapping table. After a data word of eFuses is programmed, the customer using the eFuse array uses the mapping table to identify the parity bits corresponding to the eFuse data word. The customer then programs the parity bits in the eFuse array. The customer needs to identify and program the parity bits for each word that is programmed. Associating the parity bits to corresponding data words also involves human intervention.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. The error correction algorithm in various embodiments takes information of an erroneous memory cell in a parallel format, converts the information to a serial format, and writes the information in a serial manner to a redundancy memory. When the erroneous memory cell is later accessed, the information written to the redundancy memory is used as the access data. Effectively, the erroneous memory cell is corrected. Circuits to convert and write the information in the redundancy memory are included in a chip having the memory array. When the erroneous cell is identified, the circuits are invoked to automatically program the redundancy information. In other words, correcting the erroneous memory cell is automatic and transparent to a customer using the memory array.

In an error coding and correction (ECC) mechanism, ECC parity bits are generated for each word of data. A data word having corresponding ECC information is formed in a parallel format, converted to a serial format, and written to the memory array. Circuits to convert and write the ECC information are included in the chip having the memory array. When the ECC information is to be programmed, the circuits are invoked to automatically program the ECC information.

In this document, a logical high value is represented by a "1" while a logical low value is represented by a "0."

Exemplary Memory Structure

Figure 1:
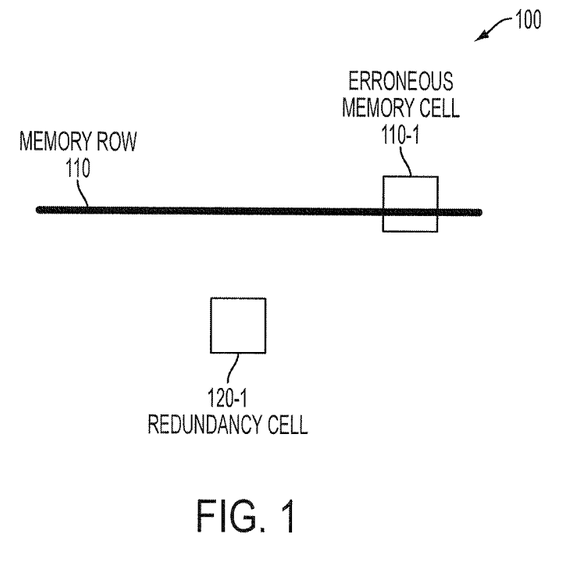
FIG. 1 is a block diagram of a memory structure, in accordance with some embodiments.

FIG. 1 is a block diagram of a memory structure 100, in accordance with some embodiments.

Memory structure 100 includes a plurality of memory cells arranged in an array format that has rows and columns. For illustration, a row 110 of memory cells is shown. Memory row 110 includes an erroneous memory cell 110-1 that has erroneous data. For example, erroneous memory cell 110-1 is supposed to store a high logical value, but the data in erroneous memory cell 110-1 is stuck at a low logical value. In some embodiments, the memory cells in memory structure 100 are electrical fuses (eFuses). In such embodiments, when an eFuse is programmed, the memory cell is said to store a high logical value. In contrast, when the eFuse is not programmed, the memory cell is said to store a low logical value.

Memory structure 100 also includes information to correct erroneous data in erroneous cells. A set of data bits having information corresponding to an erroneous memory cell is called a redundancy cell, which stores the correct data for the corresponding erroneous memory cell. In some embodiments, when a memory cell is identified as having an error, a corresponding redundancy cell is created. The correct data of the erroneous memory cell is written to the redundancy cell. When the erroneous memory cell is later accessed, the correct data of the erroneous memory cell in the corresponding redundancy cell is used in place of the erroneous data in the erroneous memory cell. Stated differently, the erroneous memory cell is corrected. As an example, after memory cell 110-1 is identified as an erroneous memory cell, a corresponding redundancy cell 120-1 is identified, and the correct data of erroneous memory cell 110-1 is written to redundancy cell 120-1. When erroneous memory cell 110-1 is later accessed, the correct data in redundancy cell 120-1 is used in place of the erroneous data stored in erroneous memory cell 110-1 as the access data.

Exemplary Redundancy Information

Figure 2:
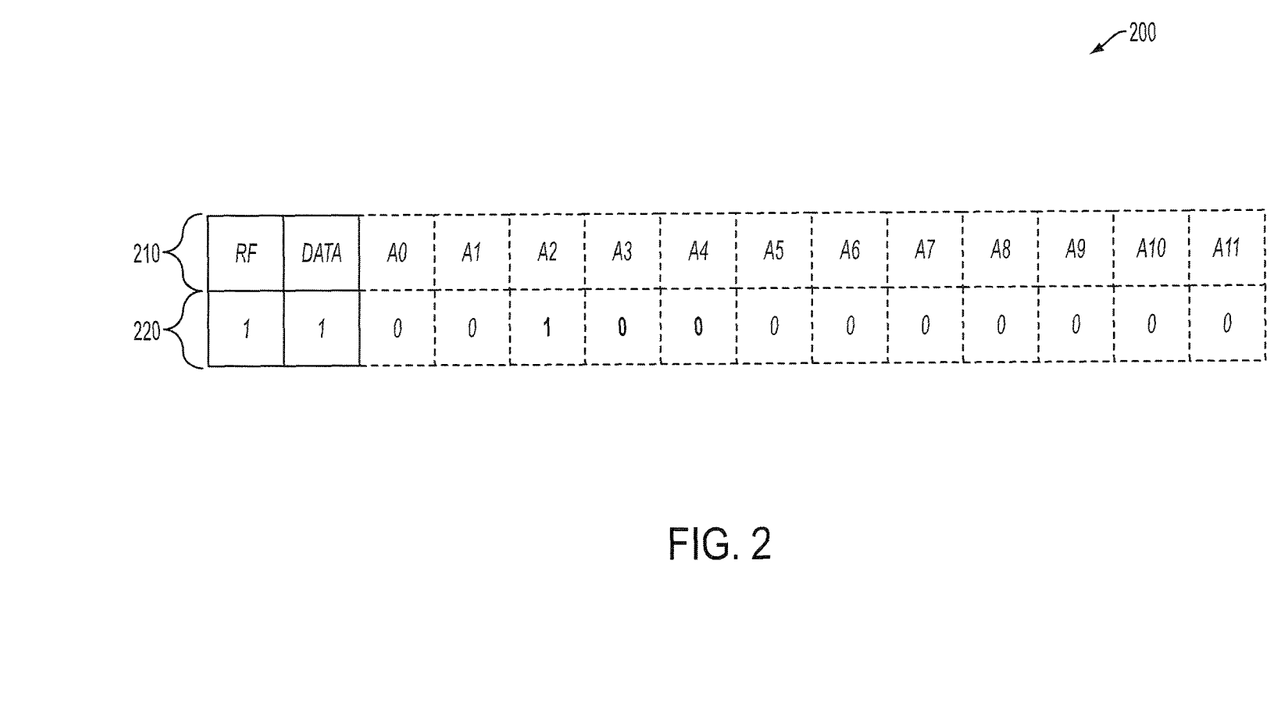
FIG. 2 is a diagram of an information word having redundancy information of an erroneous memory cell, in accordance with some embodiments.

FIG. 2 is a diagram of an information word 200 having redundancy information of erroneous memory cell 110-1, in accordance with some embodiments. Word 200 includes information to correct erroneous memory cell 110-1. Word 200 corresponds to, and is commonly called, redundancy cell 120-1 in FIG. 1.

Word 200 includes a plurality of information fields or bits. A row 210 shows names of the fields, including, for example, programming field RF, data field Data, and address fields A0-A11. Address fields are also called address lines. In some embodiments, each information field of word 200 is represented by a logical value and corresponds to an eFuse in the redundancy memory associated with memory structure 100.

A row 220 shows the logical value of each field of row 210. For example, as illustratively shown, field RF has a high logical value. Field Data has a high logical value. Address line A2 has a high logical value. Each of address lines A0, A1, and A3-A11 has a low logical value. Address lines A0-A11 are used to identify the memory location or address of memory cell 110-1. For illustration, twelve address lines A0-A11 are used. A different number of address lines is within the scope of various embodiments.

Field Data stores the correct data for the corresponding memory cell identified by address lines A0-A11. In FIG. 2, field Data stores the correct data for erroneous memory cell 110-1. For illustration, memory cell 110-1 has a low logical value as erroneous data. As a result, in FIG. 2, field Data has a high logical value, indicating that the correct data for memory cell 110-1 is a logical high value. When memory cell 110-1 is later accessed, the high logical value in field Data is used as the access data for erroneous memory cell 110-1. But if memory cell 110-1 has a high logical value as erroneous data, field Data would have a low logical value as the correct data. When memory cell 110-1 is accessed, the low logical value of field Data is used as the access data for the erroneous memory cell 110-1.

Field RF indicates whether the address information and data information corresponding to erroneous memory cell 110-1 are to be programmed. For example, whether field Data and address lines A0-A11 are to be programmed. In some embodiments, when field RF has a low logical value, the information is not to be programmed. In contrast, when field RF has a high logical value, the information to be programmed. In the embodiment of FIG. 2, memory location 120-1 in FIG. 1 is to be programmed because field RF has a logical high value.

Identifying Redundancy Information to be Programmed

Figure 3A:
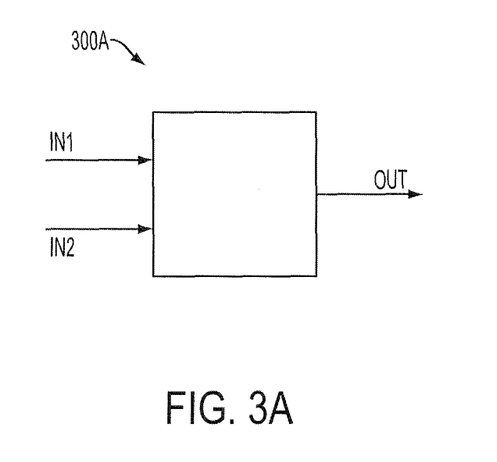
FIG. 3A is a diagram of a circuit used to identify logical values of the fields in the information word in FIG. 2, in accordance with some embodiments.
Figure 3B:
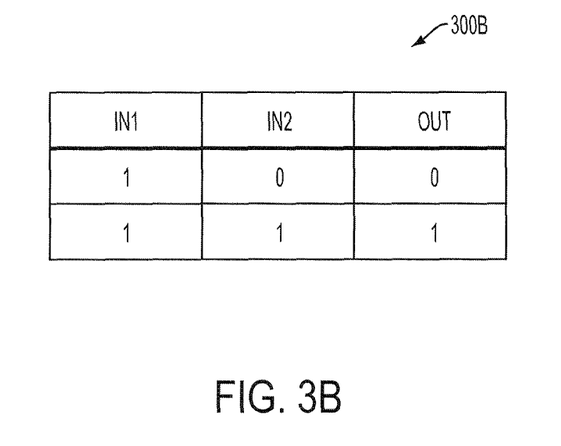
FIG. 3B is a truth table illustrating an operation of the circuit in FIG. 3A, in accordance with some embodiments.

FIG. 3A is a diagram of a circuit 300A used to identify the logical value of each information field of word 200 in FIG. 2, in accordance with some embodiments. FIG. 3B is a truth table 300B illustrating an operation of circuit 300A, in accordance with some embodiments.

Input In1 of circuit 300A is configured to receive a logical high value, which, in some embodiments, is represented by a positive pulse or a strobe. Input In2 is configured to receive information of each field of word 200. Effectively, input In2 has the logical value of each field of word 200. As illustratively shown in FIG. 3B, output Out is logically low when the logical value of input In2 is logically low and is logically high when the logical value of input In2 is logically high. Effectively, each of output Out represents an identified logical value of each information field of word 200. In the embodiments of FIGS. 3A and 3B, circuit 300A functions as a logical AND gate. Other circuits identifying the logical value of each information field of word 200 are within the scope of various embodiments. One example of such circuits is a buffer configured to receive information of each information field and passes such information to the output of the buffer.

Figure 3C:
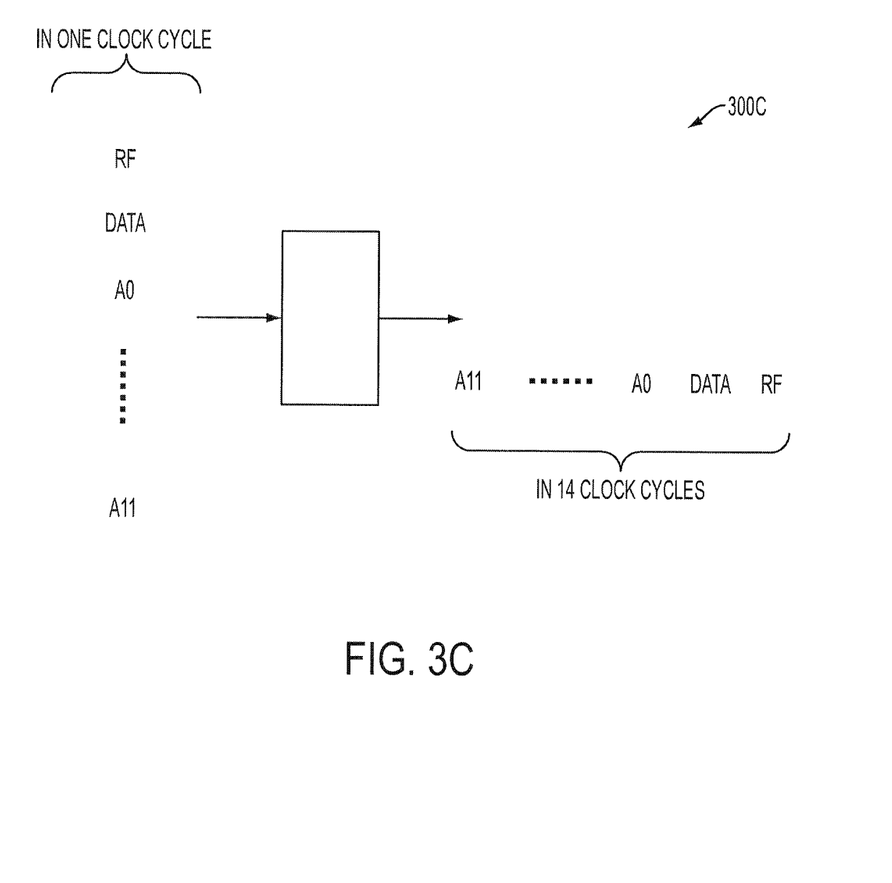
FIG. 3C is diagram of a circuit illustrating conversion of a parallel format to a serial format, in accordance with some embodiments.

FIG. 3C is a block diagram of a circuit 300C used to convert word 200 from a parallel format to a serial format, in accordance with some embodiments. For example, in the parallel format, all data of information fields RF, Data, A0-A11 are simultaneously available in one clock cycle. Circuit 300C converts word 200 from the parallel format to the serial format. As a result, each field of word 200 is available in a separate clock cycle. For example, in the serial format, field RF is available in a first clock cycle, field Data is available in a second clock cycle, address line A0 is available in a third clock cycle, etc. Finally, address line A11 is available in a fourteenth clock cycle. Consequently, a chain or a series of logical values for each field of word 200 is acquired. For example, a chain of serial logical value 11001000000000 corresponding to fields RF, Data, A0-A11 of word 200 in FIG. 2 is available in 14 clock cycles. Various different ways of converting data in a parallel format to a serial format are within the scope of various embodiments.

Programming Redundancy Information

In some embodiments, the chain of data of each information field of word 200 is written to the redundancy memory in a serial manner, and each information field corresponds to an eFuse in the redundancy memory. Effectively, each eFuse corresponding to each field of word 200 is programmed in a serial manner. Serially programming the eFuses is advantageous in some embodiments because the current shared by simultaneously programming multiple eFuses at one time can cause poor resistance of the eFuse being programmed. As an example, each eFuse corresponding to the logical value of the serial chain 11001000000000 of word 200 is programmed in one clock cycle. In some embodiments, the default data for each eFuse is a low logical value. As a result, the eFuse corresponding to the information field is programmed when the field has a high logical value. In the example of word 200 having the logical values 11001000000000, three values "1" correspond to field RF, field Data, and address line A2. Consequently, the eFuses corresponding to fields RF, field Data, and address line A2 are programmed while the eFuses corresponding to address lines A0, A1, and A3-A11 are not programmed.

In some embodiments, programming the eFuses corresponding to the fields of word 200 is done by applying a positive pulse or strobe to the eFuses. For example, the positive strobe is applied to the eFuses corresponding to fields RF, Data, and A2. The eFuses corresponding to the address lines A0, A1, and A3-A11 do not receive any strobe, and are therefore not programmed.

In some embodiments, the memory array and corresponding circuits to correct the erroneous memory cells are contained in a single chip. When the memory cell is identified as having an error, information is provided to the circuits to write the redundancy information in the redundancy memory to effectively correct the erroneous memory cell. Correcting the erroneous memory cells is automatic and transparent to the customer using the memory array. In other words, the correction process does not require human intervention. For example, memory structure 100, information word 200, circuits 300A and 300C are contained in a single chip. When erroneous memory cell 110-1 is identified, information word 200 is provided to circuits 300A and 300C to generate word 200 in the serial format having positive pulses. A programming circuit then uses the chain of positive pulses to program the corresponding eFuses in the redundancy memory.

After the eFuses corresponding to the fields of word 200 are programmed, when memory cell 110-1 is later accessed, the correct data stored in redundancy cell 120-1 is used as the access data of memory cell 110-1. For example, in some embodiments, when memory cell 110-1 is later accessed, a redundancy engine recognizes the address of memory cell 110-1 is now in the redundancy memory and corresponds to redundancy cell 120-1. As a result, the redundancy engine causes the data stored in redundancy cell 120-1 to be used as the access data.

Exemplary Method

Figure 4:
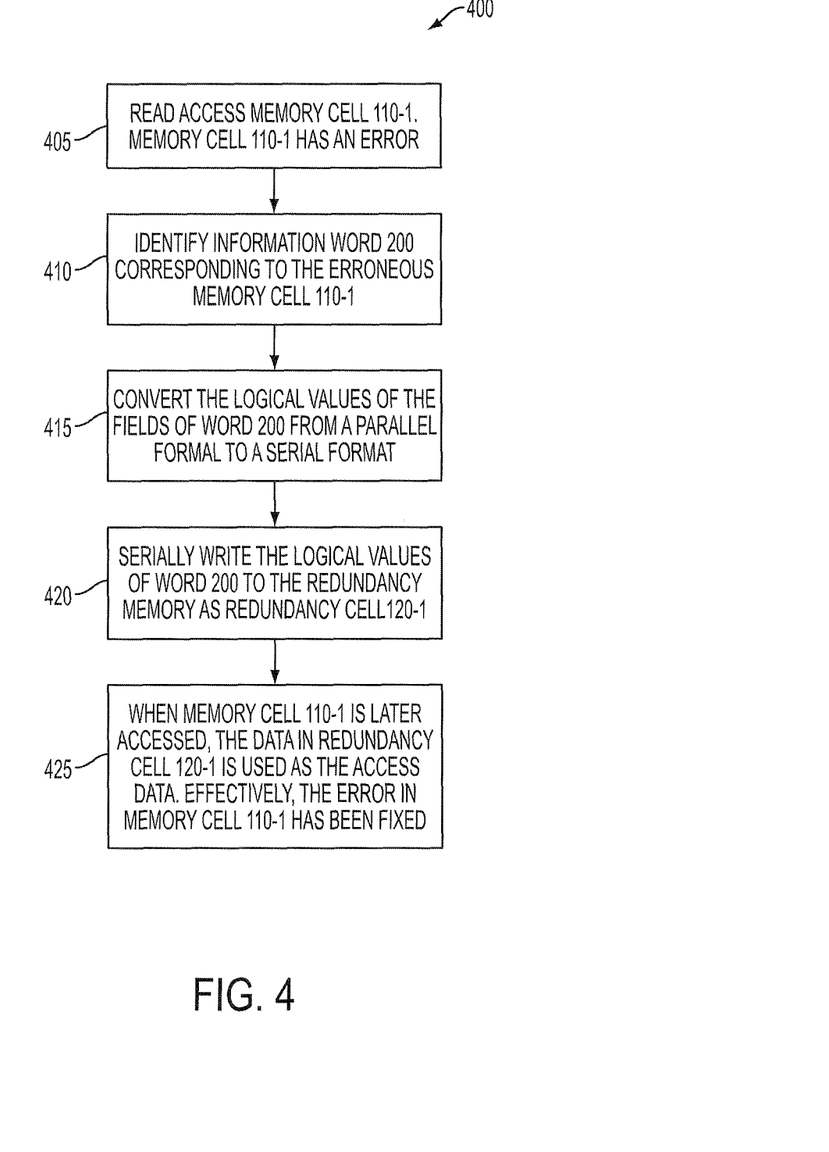
FIG. 4 is a flowchart of a method of programming memory cells, in accordance with some embodiments.

FIG. 4 is a flowchart of a method 400 of automatic correction of erroneous memory cell 110-1, in accordance with some embodiments.

In step 405, a memory cell in the memory array is read accessed. An error is identified. For illustration, memory cell 110-1 in FIG. 1 is read and an error in memory cell 110-1 is identified.

In step 410, based on the known information of erroneous memory cell 110-1, information word 200 is identified. For example, based on word 200, memory cell 110-1 is at address 4 represented by address lines A0-A11 having the logical value 001000000000. Memory cell 110-1 should have a high logical value identified as "1" in field Data of word 200. Field RF having a high logical value indicates that a set of information corresponding to erroneous memory cell 110-1 is to be programmed in the redundancy memory. In some embodiments, word 200 is provided in a parallel format.

In step 415, the logical value of each field of word 200 is identified using circuit 300A and word 200. The data of each field of word 200 is then converted to a serial format, using circuit 300C, in accordance with some embodiments.

In step 420, the logical values of the fields of word 200 are serially written to the redundancy memory. For example, in some embodiments, the eFuses corresponding to each field of word 200 are serially programmed. Redundancy cell 120-1 is thus created and corresponds to erroneous memory cell 110-1.

In step 425, when memory cell 110-1 is later accessed, the data stored in redundancy cell 120-1 is used as the access data. Stated in another way, the erroneous memory cell 110-1 has been corrected.

In some embodiments, memory structure 100, word 200, circuit 300A, circuit 300C, and the programming circuit are in a single semiconductor chip. As a result, after erroneous memory cell 110-1 is identified, converting information word 200 to serial and programming the eFuses corresponding to the fields of word 200 are automatic.

Error Code and Correction

Figure 5:
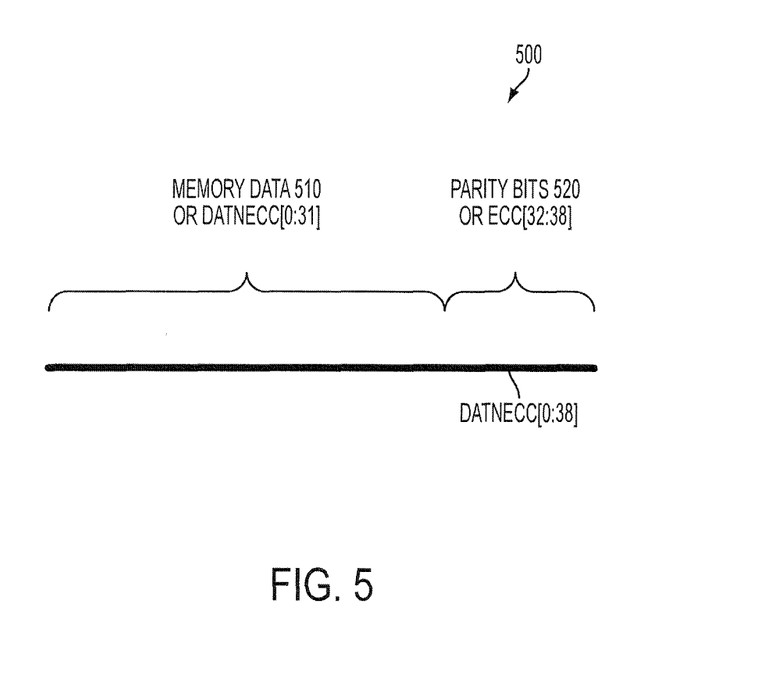
FIG. 5 is a diagram of a memory word in a memory structure related to error code and correction (ECC), in accordance with some embodiments.

FIG. 5 is a diagram of a word 500 of in a memory structure related to an error code and correction, in accordance with some embodiments.

Word 500 includes a memory data word 510 and a plurality of corresponding ECC parity bits 520. For illustration, memory data word 510 includes 32 bits corresponding to 32 bits of word 500, which are represented by DATNECC[0:31]. ECC parity bits 520 include seven bits and are represented by DATNECC[32:38]. Effectively, word 500 includes 39 bits represented by DATNECC[0:38]. Word 500 and word DATNECC are used interchangeably. Word 500 having 39 bits is used for illustration. Words having a different number of data bits and/or parity bits are within the scope of various embodiments.

Memory data word 510 includes data to be written to a memory array. In various situations, a bit or a memory cell in data word 510 is erroneous. For example, a memory cell is stuck at a logical value, such as a high or a low logical value. In some embodiments, an ECC engine (not shown) provides ECC parity bits 520 used to identify and correct the erroneous memory cell. For example, in a Hamming code ECC, seven parity bits are provided to identify and correct the erroneous memory cell. Different ways of acquiring parity bits 520 based on data word 510 are within the scope of various embodiments.

In some embodiments, word 500 is converted from a parallel format to a serial format similar to the conversion explained above with reference to FIGS. 3A, 3B, and 3C. For example, initially, all bits of word DATNECC[0:38] are in the parallel format, and are therefore available in one clock cycle. After the serial conversion, bit DATNECC[0] is available in a first clock cycle, bit DATNECC[1] is available in a second clock cycle, etc., until bit DATNECC[38] is available in a $39^{th}$ clock cycle. Word DATNECC[0:38] is then written to the memory array. Effectively, for each data word 510, there are corresponding seven parity bits used to identify and correct an erroneous bit in word 510.

In some embodiments, each bit of word DATNECC[0:38] corresponds to an eFuse in an eFuse array. Thirty nine eFuses corresponding to 39 bits of word DATNEEC[0:38] are programmed. In some embodiments, by default, the eFuses are not programmed and are therefore considered to store low logical values. After the eFuses are programmed, the programmed eFuses store high logical values. In some embodiments, programming an eFuse is done by applying a positive pulse or strobe to the eFuse.

In some embodiments, the circuits to perform the above functions illustrated in FIG. 5 are in a single chip. When a data word is to be written, the circuits are invoked to perform their respective functions automatically without human intervention. For example, circuit 300A to identify the logical value of word DATNECC that combines data 510 and ECC information 520, circuit 300C to convert word DATNECC in the parallel format to the serial format, and the circuit to program the eFuses corresponding to word DATNECC are in a single chip. Writing word DATNECC to the memory array is transparent to the user using the chip.

Exemplary Method Regarding ECC

Figure 6:
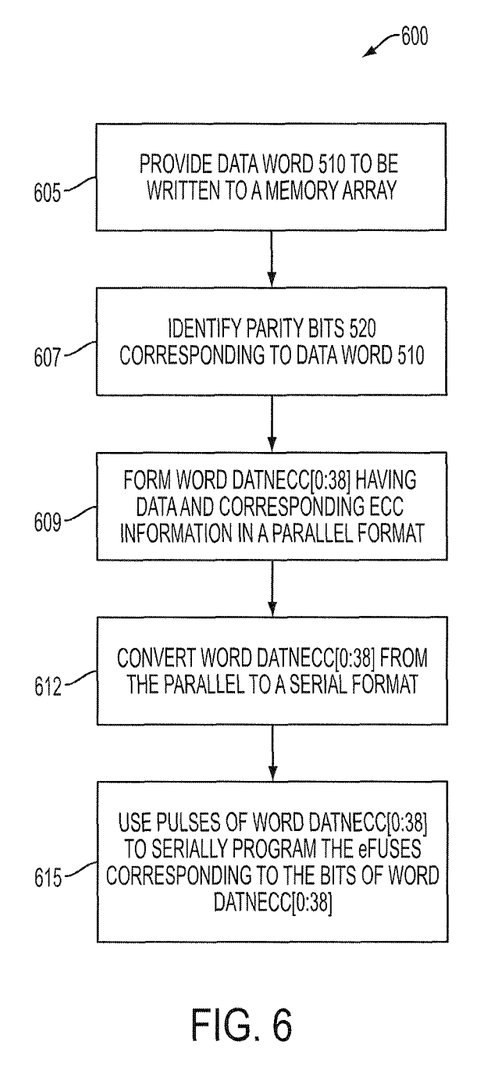
FIG. 6 is a flowchart of a method of writing memory data and corresponding ECC information, in accordance with some embodiments.

FIG. 6 is a flowchart of a method 600 of automatically writing a data word 510 and the ECC parity bits 520 corresponding to the data word 510, in accordance with some embodiments.

In operation 605, a customer provides a data word 510 to be written to a memory array.

In operation 607, an ECC engine, based on the data of data word 510, identifies the corresponding seven parity bits 520.

In operation 609, the ECC engine forms word 500 or word DATNECC[0:38] having combined data word 510 and parity bits 520 in a parallel format.

In operation 612, circuits 300A and 300C in FIGS. 300A and 300C convert word DATNECC[0:38] from the parallel format to a serial format. Effectively, output of circuit 300C includes a chain of pulses corresponding to bits of word DATNECC[0:38].

In operation 615, the pulses of word DATNECC[0:38] are used to serially program the eFuses corresponding to the bits of word DATNECC[0:38]. In some embodiments, the default data value for each of the eFuses is a low logical value. As a result, only the eFuses corresponding to the bits having positive pulses are written or programmed. Effectively, only the eFuses corresponding to the bits having a high logical value are programmed.

Various embodiments of the disclosure are advantageous over an existing approach because the customer using the memory array does not use a mapping table that stores the ECC information of the corresponding data words. In various embodiments of the present disclosure, writing the data with the ECC information is automatic and transparent to the customer. In contrast, in an existing approach, a manufacturer of the memory array provides $2^{32}$ combinations of each seven parity bits in a mapping table. When the customer wants to write data to the memory array, the customer uses the mapping table to find the corresponding seven parity bits for each word of 32 bits in the memory array. The customer then writes 39 bits to the memory array.

A number of embodiments have been described. It will nevertheless be understood that various modifications may be made without departing from the spirit and scope of the disclosure. The low or high logic value of various signals used in the above description is also for illustration. Various embodiments are not limited to a particular value when a signal is activated and/or deactivated. Selecting different values is within the scope of various embodiments. Words 200 and 500 being provided in a parallel format and converted to a serial format are for illustration. Different formats are within the scope of various embodiments. The order of the fields in words 200 and 500 shown in respective FIGS. 2 and 5 are for illustration. Other orders of the fields are within the scope of various embodiments.

In some embodiments, in a method, a plurality of bits is converted by a first circuit in a first format to a second format. The plurality of bits in the second format is used to program a plurality of memory cells corresponding to the plurality of bits using a second circuit. The first circuit and the second circuit are electrically coupled together in a first chip. The plurality of bits is selected from the group consisting of 1) address information, cell data information, and program information of a memory cell that has an error; and 2) word data information of a first word and error code and correction information corresponding to the word data information of the first word.

In some embodiments, a memory structure comprises a conversion engine and a program engine. The conversion engine is configured to receive a plurality of bits in a first format, and to convert the plurality of bits in the first format to a second format. Each bit of the plurality of bits corresponds to a first memory cell and has a logical value. The program engine is electrically coupled to the conversion engine and configured to receive the plurality of bits in the second format as inputs, and to program the first memory cell corresponding to the each bit of the plurality of bits, based on the logical value of the each bit of the plurality of bits. The conversion engine and the program engine are in a single chip. The plurality of bits includes address information and data information of a second memory cell that has an error.

In some embodiments, a memory structure comprises a conversion engine and a program engine. The conversion engine is configured to receive a plurality of bits in a first format, and to convert the plurality of bits in the first format to a second format. Each bit of the plurality of bits corresponds to a first memory cell and has a logical value. The program engine is electrically coupled to the conversion engine and configured to receive the plurality of bits in the second format as inputs, and to program the first memory cell corresponding to the each bit of the plurality of bits, based on the logical value of the each bit of the plurality of bits. The conversion engine and the program engine are in a single chip. The plurality of bits includes information of a data word and information of error code associated with the information of the data word.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A method, comprising:
   by a first circuit, converting a plurality of bits in a first format to a second format; and
   by a second circuit, causing a plurality of redundancy memory cells of a memory structure to store an information word corresponding to logical values of the plurality of bits,
   wherein
   the first circuit and the second circuit are electrically coupled together in a first chip; and
   the information word corresponding to the logical values of the plurality of bits comprises address information, cell data information, and program information of a memory cell of the memory structure that has an error.

2. The method of claim 1, wherein
   the plurality of redundancy memory cells includes at least one electrical fuse.

3. The method of claim 1, wherein the cell data information includes correct data for the memory cell that has the error.

4. The method of claim 3, further comprising accessing the memory cell that has the error, and using the cell data information as access data.

5. The method of claim 1, wherein causing the plurality of redundancy memory cells to store the information word comprises programming a redundancy memory cell of the plurality of redundancy memory cells when a bit of the plurality of bits corresponding to the memory cell has a first logical value and not programming the redundancy memory cell of the plurality of redundancy memory cells when the bit of the plurality of bits corresponding to the memory cell has a second logical value different from the first logical value.

6. The method of claim 1, further comprising, by a third circuit in the first chip, acquiring an error code and correction information based on a memory data word.

7. The method of claim 6, further comprising using Hamming code and correction information to provide the error code and correction information corresponding to the memory data word.

8. The method of claim 6, wherein the memory data word includes thirty two bits and the error code and correction information are included in seven bits.

9. A memory structure comprising:
a conversion engine configured
to receive a plurality of bits in a first format, and
to convert the plurality of bits in the first format to a second format, wherein each bit of the plurality of bits corresponds to a redundancy memory cell of a plurality of redundancy memory cells of the memory structure and has a logical value; and
a program engine electrically coupled to the conversion engine and configured to receive the plurality of bits in the second format as inputs, and
to cause the plurality of redundancy memory cells to store an information word corresponding to the logical values of the plurality of bits,
wherein
the conversion engine and the program engine are in a single chip; and
the information word corresponding to the logical values of the plurality of bits includes address information and data information of a memory cell of the memory structure that has an error.

10. The memory structure of claim 9, wherein
at least one of the plurality of redundancy memory cells or the memory cell that has the error is an electrical fuse.

11. The memory structure of claim 9, wherein
the memory cell is an electrical fuse; and
the program engine is configured to cause the plurality of redundancy memory cells to store the logical values of the plurality of bits in a serial manner.

12. The memory structure of claim 9, wherein the data information of the information word includes correct data information of the memory cell that has the error.

13. The memory structure of claim 12, wherein the data information of the information word that is stored in the plurality of redundancy memory cells is provided as access data when the memory cell that has the error is accessed.

14. A memory structure comprising:
a conversion engine configured
to receive a plurality of bits in a first format, and
to convert the plurality of bits in the first format to a second format, wherein each bit of the plurality of bits corresponds to a redundancy memory cell of a plurality of redundancy memory cells of the memory structure and has a logical value; and
a program engine electrically coupled to the conversion engine and configured
to receive the plurality of bits in the second format as inputs, and
to cause the plurality of redundancy memory cells to store an information word corresponding to the logical values of the plurality of bits,
wherein
the first format is a parallel format;
the second format is a serial format;
the conversion engine and the program engine are in a single chip; and
the information word corresponding to the logical values of the plurality of bits includes address information and data information of a memory cell of the memory structure that has an error.

15. The memory structure of claim 14, wherein
at least one of the plurality of redundancy memory cells or the memory cell that has the error is an electrical fuse.

16. The memory structure of claim 14, wherein
the memory cell is an electrical fuse; and
the program engine is configured to process in a serial manner the plurality of redundancy memory cells to store the logical values of the plurality of bits.

17. The memory structure of claim 14, further comprising an error code engine configured to generate information of an error code associated with information of a data word based on the information of the data word.

18. The memory structure of claim 17, wherein the information of error code is Hamming error code information.

19. The memory structure of claim 17, wherein
the data word includes thirty two bits; and
the information of the error code is included in seven bits.

20. The method of claim 1, wherein the first format is a parallel format or the second format is a serial format.

* * * * *